United States Patent
Duclos

[19]

[11] Patent Number: 5,994,760
[45] Date of Patent: Nov. 30, 1999

[54] DEVICE HAVING A LOW THRESHOLD VOLTAGE FOR PROTECTION AGAINST ELECTROSTATIC DISCHARGES

[75] Inventor: Franck Duclos, Tours, France

[73] Assignee: STMicroelectronics S.A., Saint Genis, France

[21] Appl. No.: 09/176,418

[22] Filed: Oct. 21, 1998

[30] Foreign Application Priority Data

Oct. 24, 1997 [FR] France ................................. 97 13591

[51] Int. Cl.⁶ .......................... H01L 29/00; H01L 29/74; H01L 31/111
[52] U.S. Cl. ......................... 257/546; 257/109; 257/173; 257/497
[58] Field of Search ................................. 257/109, 173, 257/174, 497, 546

[56] References Cited

U.S. PATENT DOCUMENTS

| 5,311,042 | 5/1994 | Anceau | 257/173 |
| 5,401,985 | 3/1995 | Anceau | 257/173 |
| 5,646,433 | 7/1997 | Jimenez | 257/355 |
| 5,747,837 | 5/1998 | Iwase et al. | 257/173 |
| 5,880,488 | 3/1999 | Yu | 257/111 |

OTHER PUBLICATIONS

Patent Abstracts of Japan, vol. No. 095, No. 011, Dec. 26, 1995, & JP 07 221269, Aug. 18, 1995.
Patent Abstracts of Japan, vol. No. 010, No. 005, (E–372), Jan. 10, 1986, & Jp 60 169110, Sep. 2, 1985.

*Primary Examiner*—Ngân V. Ngô
*Attorney, Agent, or Firm*—Wolf, Greenfield & Sacks, P.C.

[57] ABSTRACT

The present invention relates to an assembly of two pairs of diodes in a single semiconductor substrate of a first type of conductivity, the first pair including a first diode in series with a second diode, the second pair including a third diode in series with a fourth diode, the two pairs of diodes being arranged in parallel. Each of the first and third diodes includes neighboring regions of distinct types of conductivity formed in a lightly-doped well of the second type of conductivity, these wells being separated; each of the second and fourth diodes includes separated regions of distinct types of conductivity; and metallizations connect the electrodes of the diodes to form the desired series-to-parallel assembly.

6 Claims, 3 Drawing Sheets

DEVICE HAVING A LOW THRESHOLD VOLTAGE FOR PROTECTION AGAINST ELECTROSTATIC DISCHARGES

BACKGROUND OF THE INVENTION

1. Field of the Invention

The present invention relates to an assembly of protection diodes of low voltage level having a low protection voltage threshold that protect against electrostatic discharges. The present invention applies in particular to the protection of a hard disk read head.

2. Discussion of the Related Art

The increase of the storage capacities of hard disks requires the use of magneto-resistive read heads of very small dimensions. The new read heads allow disks to reach very high storage densities.

As very schematically illustrated in FIG. 1, a magneto-resistive head (MRH) 1 is generally connected to a support 2 by a thin sheet of a flexible material 3 on which are applied connection wires 4, 5, of the head. Flexible sheet 3 is of very small dimension. It has, for example, a length on the order of 5 to 10 mm and a width on the order of a few millimeters.

These heads are meant to be biased to a d.c. voltage on the order of a few hundreds of millivolts to optimize the reception of signals of very low amplitude on the order of one millivolt at frequencies higher than 100 MHz.

Given these very low voltage values, the heads, upon manufacturing and before their assembly in a circuit, are very sensitive to electrostatic discharges. It is known that electrostatic discharges can occur upon handling of the heads by tools or by hand. Electrostatic discharges can reach a few tens to a few hundreds of volts and are generally destructive to the headsso the manufacturing and assembly efficiency are extremely low.

These heads must be provided with protection against electrostatic discharges (ESD). The protection must:

be bi-directional, since ESDs can be positive or negative;

have a very low protection voltage threshold;

have a very low leakage current for the d.c. biasing of the head; and having a very low capacitance, so as not to attenuate the signals which, as previously indicated, can have a frequency higher than 100 MHz.

Further, the device has to be of very small dimension since it is desirable to be able to assemble it on flexible plate 3 without substantially increasing its inertia.

The conventional solution of protection against ESDs at very low threshold voltages is illustrated in FIG. 2. This solution includes arranging two pairs of diodes (D1–D2; D3–D4) in series, each of these pairs being in parallel and in opposition with respect to the other, across device 1 to be protected. However, the conventional solution to implement this assembly of four diodes D1 to D4 is not compatible with several of the conditions required for the protection of magneto-resistive heads. Indeed, discrete diodes, each mounted in a package or mounted together in a common package, are conventionally used. This has the disadvantage that the package inevitably has a non-negligible dimension and weight.

SUMMARY OF THE INVENTION

Thus, an object of the present invention is to provide a protection device formed of a parallel assembly of two pairs of diodes in series overcoming all or at least some of the above-mentioned disadvantages of prior art solutions.

Another object of the present invention is to provide such an assembly implemented in the form of a monolithic silicon chip.

Another object of the present invention is to provide such an assembly which has a low capacitance.

To achieve these and other objects, the present invention provides an assembly of two pairs of diodes in a single semiconductor substrate of a first type of conductivity, the first pair including a first diode in series with a second diode, the second pair including a third diode in series with a fourth diode, the two pairs of diodes being arranged in parallel. Each of the first and third diodes includes neighboring regions of different or distinct types of conductivity formed in a lightly-doped well of the second type of conductivity, these wells being separated; each of the second and fourth diodes includes separated regions of distinct types of conductivity; and metallizations connect the electrodes of the diodes to form the desired series-to-parallel assembly.

According to an embodiment of the present invention, the connections between the series diodes are resistive.

According to an embodiment of the present invention, the second and fourth diodes are formed directly in the substrate.

According to an embodiment of the present invention, the second and fourth diodes are formed in separated wells of the second type of conductivity, separated from the wells containing the first and third diodes.

According to an embodiment of the present invention, the metallization connecting the first diode to the second diode and the metallization connecting the third diode to the fourth diode are interconnected.

According to an embodiment of the present invention, the metallization connecting the first diode to the fourth diode and the metallization connecting the second diode to the third diode are provided with bumps.

The foregoing objects, features and advantages of the present invention, will be discussed in detail in the following non-limiting description of specific embodiments in connection with the accompanying drawings.

DETAILED DESCRIPTION

Figure 3:
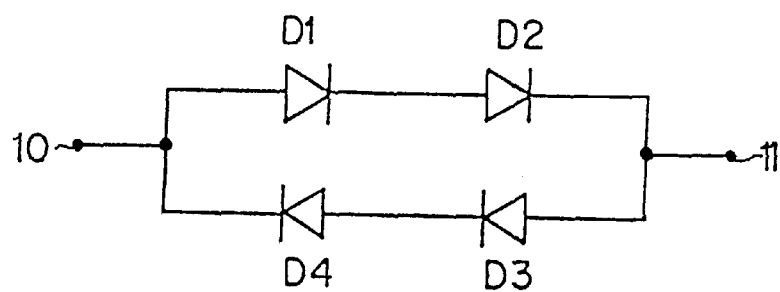
FIG. 3 shows the diagram of the structure of protection against ESDs which is desired to be implemented in monolithic form according to the present invention.

FIG. 3 shows the structure that the present invention aims at implementing in monolithic form. This structure includes, between two terminals 10 and 11, a first pair of diodes in series D1, D2 that become forward biased in response to a voltage of a first polarity and a second pair of diodes in series D3, D4 that become forward biased in response to a voltage of an opposite polarity.

Figure 4A:
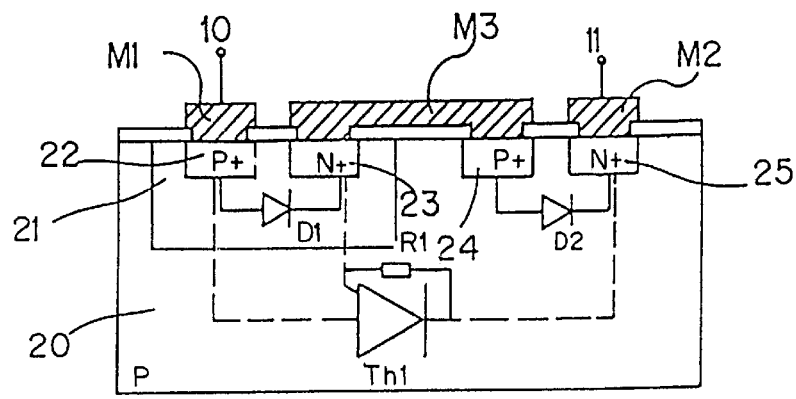
FIGS. 4A and 4B show cross-sectional views of an embodiment of a protection structure according to the present invention.
Figure 4B:
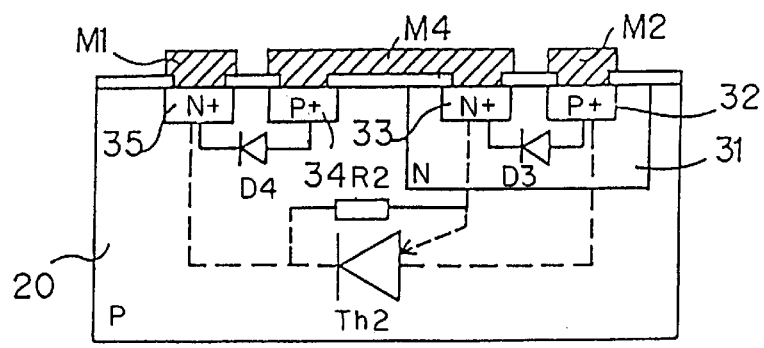
Figure 4C:
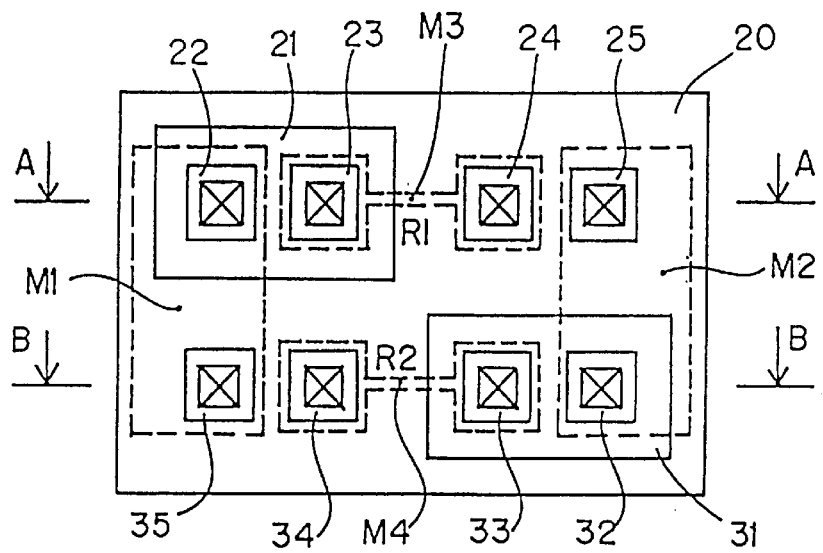
FIG. 4C shows a top view of an embodiment of the protection structure according to the present invention, FIGS. 4A and 4B respectively being cross-sectional views thereof along lines AA and BB.

FIGS. 4A, 4B, 4C show in a very simplified way an embodiment of a structure according to the present invention implemented in a P-type substrate. FIG. 4C is a top view. FIGS. 4A and 4B respectively are a cross-sectional view along line AA and a cross-sectional view along line BB, that is, respectively showing diodes D1 and D2 on the one hand, and diodes D3 and D4 on the other hand.

As is shown in FIG. 4A, the structure includes a P-type substrate 20 in which a lightly-doped N-type well 21 is formed. Diode D1 is a lateral diode formed from separated P$^+$and N$^+$regions 22 and 23 in well 21. Diode D2 includes separated P$^+$and N$^+$regions 24 and 25 formed directly in substrate 20.

Similarly, as is shown in FIG. 4B, diodes D3 and D4 are formed from the same substrate 20. Diode D3 is formed in an N-type well 31 and includes separated P$^+$and N$^+$regions 32 and 33. Diode D4 is directly formed in substrate 20 and includes separated P$^+$and N$^+$regions 34 and 35. A metallization M4 connects P$^+$and N$^+$regions 22 and 35, and corresponds to terminal 10. This metallization, like the other metallizations of FIG. 4C, rests upon an insulating layer and is in contact with its underlying layers at masked locations X. A metallization M2 connects P$^+$and N$^+$regions 25 and 32 and corresponds to terminal 11. A metallization M3 connects P$^+$and N$^+$regions 23 and 24. A metallization M4 connects P$^+$and N$^+$regions 33 and 34. In other words, metallizations M1 and M2 form the output terminals of the two parallel pairs of diodes and metallizations M3 and M4 connect in series each of the diodes of a given pair.

In the top view of FIG. 4C, metallizations M3 and M4 have been shown with a shrunk portion between the contacting areas. This is meant to symbolize the fact that series resistors can be provided, respectively RI and R2', between diodes D1 and D2 and between diodes D3 and D4. These series resistors could be formed by any known means, for example, by diffused regions. The four diodes D1 to D4 have thus been implemented in monolithic form. P$^+$and N$^+$regions can have small surfaces and accordingly, each of the diodes will have a very low stray capacitance, further reduced due to the series assembly of each of the diodes in a pair.

An additional advantage of the structure illustrated in FIG. 4 is that each of the series diodes is associated with a parasitic thyristor structure. These thyristors are schematically illustrated, connected to connections in dotted lines, in FIGS. 4A and 4B. Thyristor Thl of FIG. 4A has, as an anode, P$^+$region 22, as an anode gate, N regions 23 and 21, and as a cathode, N$^+$region 25. Thyristor Th2 of FIG. 4B has, as an anode, P$^+$region 32, as an anode gate, N regions 31 and 33, and as cathodes, N$^+$region 35. Resistors R1 and R2 are arranged between the gate and the cathode of each of the thyristors. In this assembly, the parasitic thyristors have an advantage. Indeed, if a high current corresponding to an electrostatic discharge (ESD) flows through diodes D1 and D2, inevitably, the voltage across the diodes increases when the current flowing therethrough increases. Here, as soon as this current exceeds a given threshold, thyristor ThI turns on and the voltage between terminals 10 and II drops. Thyristor Th2 plays an equivalent function in the case of an ESD of opposite polarity.

Figure 5:
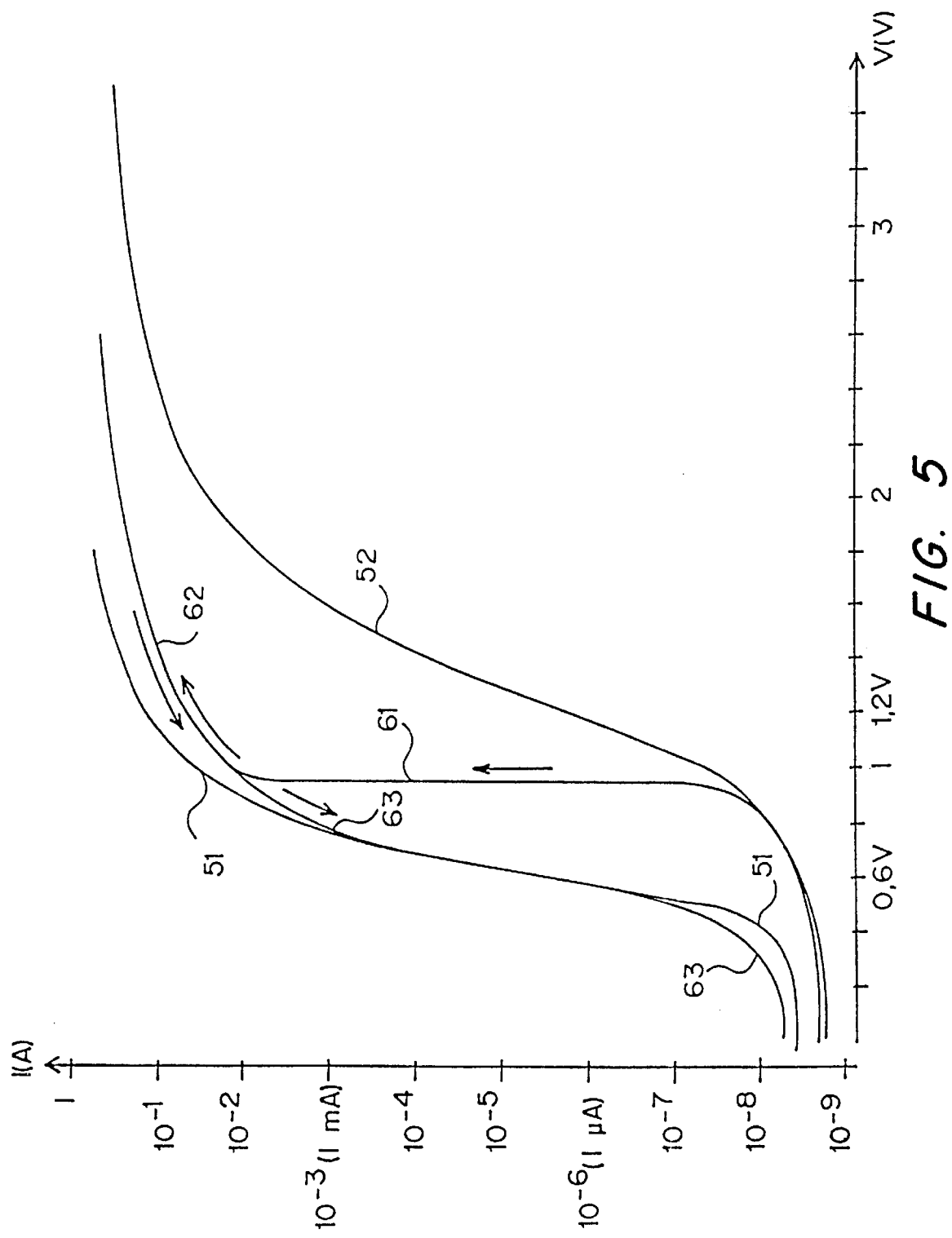
FIG. 5 shows comparative current/voltage curves of structures according to prior art and according to the present invention.

FIG. 5 shows the static series resistance current/voltage characteristics of a single diode (curve 51), of two discrete diodes in series (curve 52), and of an assembly of monolithic diodes associated with a parasitic thyristor according to the present invention (curve 61, 62, 63). These curves allow qualitative estimation of the protection efficiency of the various devices.

For a single diode, as is shown by curve 51, the current abruptly increases in the diode as soon as the voltage thereacross substantially exceeds 0.6 V, but then, in the upper portion of curve 51, the current increases less rapidly and the voltage across the diode can reach 2 V when the current reaches a value on the order of one ampere.

As has been previously discussed, it is preferred, according to prior art, to use two diodes in series instead of a single diode to reduce the capacitance of the assembly. Thus, the current starts increasing in the diodes when the voltage reaches a value on the order of 1.2 V. The disadvantage of this assembly is that, as is shown in FIG. 5, when the current in the diodes reaches a value on the order of one ampere, the voltage across the diodes can reach values higher than 3 V, which voltage can be excessive for the protection of sensitive devices such as hard disk magneto-resistive heads.

Curve 61–62 shows the current increase in a device according to the present invention. It can be seen that the current abruptly increases as soon as the voltage across the two series diodes reaches a value on the order of one volt, which corresponds to the triggering of the parasitic thyristor. Then, the device exhibits a much lower voltage drop than that which appears for two conventional diodes in series (curve 52). Curves 62, 63 show the voltage variation across the thyristor when the current decreases.

It should be noted that the curves of FIG. 5 correspond to simulations performed by the applicant for specific values of the different doping levels. In a known manner, the dopings of the various layers can be optimized to enhance the efficiency of the parasitic thyristor and maintain a constant voltage drop over a larger current range. The triggering of the parasitic thyristors can thus be optimized by varying the values of resistances R1, R2. The thyristor effect can also be enhanced by also forming diodes D2 and D4 in lightly-doped N wells.

Figure 1:
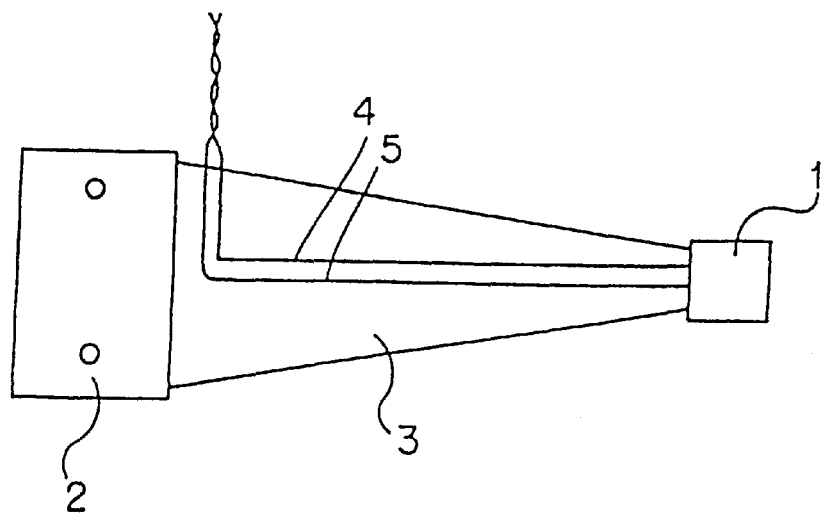
FIG. 1 shows a hard disk magneto-resistive read head assembly.
Figure 2:
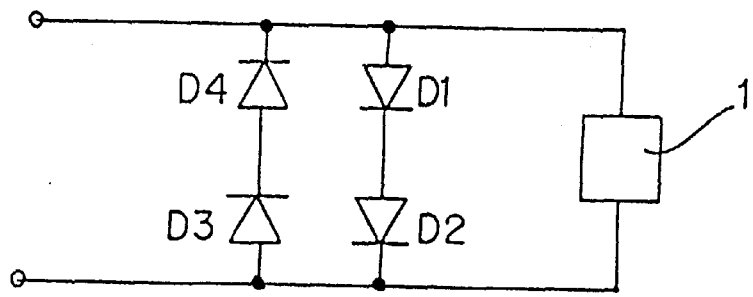
FIG. 2 shows a conventional diagram of protection against electrostatic discharges (ESD)

Thus, the assembly of the present invention provides the desired results:

It is implemented in monolithic form. It can thus correspond to a very light component which can be directly mounted on the flexible head of the head. A bump assembly, in which each of metallizations M1 and M2 is associated with a conductive bump of welding type directly mounted on wires 4, 5, of the head (see FIG. 1) can, for example, be used. This assembly can also be implemented with wires.

It can have a very low stray capacitance, lower than 5 pF.

It reduces or minimizes the voltage drop across the protection device when the current increases by thyristor effect.

Of course, the present invention is likely to have various alterations, modifications, and improvements which will readily occur to those skilled in the art.

According to a first alternative, the assembly can be implemented in an N-type substrate instead of a P-type substrate, all types of conductivity being then inverted. In this case, it should be noted that the parasitic thyristors are cathode-gate thyristors instead of anode-gate thyristors. According to another alternative, which may be combined with the preceding ones, metallizations M3 and M4 connecting in series each of the pairs of diodes can correspond to a single metallization. However, in the case of a critical structure, this alternative is not preferred since it may reduce the gain of the parasitic thyristors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An assembly of two pairs of diodes in a single semiconductor substrate of a first type of conductivity, the first pair including a first diode in series with a second diode, the second pair including a third diode in series with a fourth diode, the two pairs of diodes being arranged in parallel, wherein:

each of the first and third diodes includes neighboring regions of distinct conductivity types formed in a lightly-doped well of the second conductivity type, these wells being separated;

each of the second and fourth diodes includes separated regions of distinct conductivity types; and metallizations connect the electrodes of the diodes to form the desired series-to-parallel assembly.

2. The assembly of claim 1, wherein the connections between the series diodes are resistive.

3. The assembly of claim 1, wherein the second and fourth diodes are formed directly in the substrate.

4. The assembly of claim 1, wherein the second and fourth diodes are formed in separated wells of the second conductivity type, separated from the wells containing the first and third diodes.

5. The assembly of claim 1, wherein the metallization connecting the first diode to the second diode and the metallization connecting the third diode to the fourth diode are interconnected.

6. The assembly of claim 1, wherein the metallization connecting the first diode to the fourth diode and the metallization connecting the second diode to the third diode are provided with bumps.

* * * * *

UNITED STATES PATENT AND TRADEMARK OFFICE
CERTIFICATE OF CORRECTION

PATENT NO. : 5,994,760
DATED : November 30, 1999
INVENTOR(S) : Franck Duclos

It is certified that error appears in the above-identified patent and that said Letters Patent is hereby corrected as shown below:

Column 1 line 34 should read:

destructive to the heads so the manufacturing and assembly

Column 3, lines 27-30 should read:

X. A metallization M2 connects $P^+$ and $N^+$ regions 32 and 25 and corresponds to terminal 11. A metallization M3 connects $P^+$ and $N^+$ regions 24 and 23. A metallization M4 connects $P^+$ and $N^+$ regions 34 and 33. In other words, metallizations

Signed and Sealed this

Thirtieth Day of May, 2000

Attest:

Q. TODD DICKINSON

*Attesting Officer*  *Director of Patents and Trademarks*